(12) United States Patent
Ahn

(10) Patent No.: US 8,999,784 B2
(45) Date of Patent: Apr. 7, 2015

(54) METHODS OF MANUFACTURING SEMICONDUCTOR DEVICE

(75) Inventor: Sang Tae Ahn, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 308 days.

(21) Appl. No.: 13/602,104

(22) Filed: Sep. 1, 2012

(65) Prior Publication Data

US 2013/0157453 A1    Jun. 20, 2013

(30) Foreign Application Priority Data

Dec. 20, 2011    (KR) .................. 10-2011-0138198

(51) Int. Cl.

| | |
|---|---|
| H01L 29/788 | (2006.01) |
| H01L 21/336 | (2006.01) |
| H01L 29/792 | (2006.01) |
| H01L 29/66 | (2006.01) |
| H01L 21/28 | (2006.01) |
| B82Y 10/00 | (2011.01) |
| B82Y 40/00 | (2011.01) |
| H01L 29/423 | (2006.01) |
| H01L 27/115 | (2006.01) |
| H01L 29/06 | (2006.01) |

(52) U.S. Cl.
CPC ............ *H01L 29/788* (2013.01); *H01L 29/792* (2013.01); *H01L 29/66833* (2013.01); *H01L 21/28282* (2013.01); *B82Y 10/00* (2013.01); *B82Y 40/00* (2013.01); *H01L 21/28273* (2013.01); *H01L 29/42332* (2013.01); *H01L 27/11521* (2013.01); *H01L 29/0673* (2013.01); *H01L 29/66825* (2013.01); *H01L 29/7881* (2013.01)

(58) Field of Classification Search
CPC .............. H01L 29/792; H01L 29/7923; H01L 29/7926; H01L 29/66833; H01L 21/28282; H01L 29/788; H01L 29/7881; H01L 29/7883; H01L 29/7884; H01L 29/66825
USPC .......... 438/257, 264, 266, 287; 257/314, 315, 257/316, E29.3

See application file for complete search history.

(56) References Cited

U.S. PATENT DOCUMENTS

| | | | |
|---|---|---|---|
| 7,498,233 B2 * | 3/2009 | Kim et al. ...................... | 438/437 |
| 8,361,862 B2 * | 1/2013 | Fukuzumi et al. ............. | 438/257 |
| 8,377,817 B2 * | 2/2013 | Park et al. ...................... | 438/618 |
| 2006/0017093 A1 * | 1/2006 | Kwon et al. ................... | 257/315 |
| 2006/0022241 A1 * | 2/2006 | Shimojo et al. ................ | 257/296 |
| 2006/0079051 A1 * | 4/2006 | Chindalore et al. ........... | 438/257 |
| 2007/0090443 A1 * | 4/2007 | Choi et al. ..................... | 257/314 |
| 2008/0318381 A1 * | 12/2008 | Matamis et al. .............. | 438/264 |
| 2009/0173981 A1 * | 7/2009 | Nitta .............................. | 257/302 |
| 2010/0178755 A1 * | 7/2010 | Lee et al. ....................... | 438/479 |
| 2011/0031546 A1 * | 2/2011 | Uenaka et al. ................. | 257/316 |

(Continued)

FOREIGN PATENT DOCUMENTS

JP    2004207739 A    *   7/2004   .......... H01L 21/8247

*Primary Examiner* — Michele Fan
(74) *Attorney, Agent, or Firm* — William Park & Associates Patent Ltd.

(57) ABSTRACT

A method of manufacturing a semiconductor device includes forming first auxiliary patterns, alternately forming first material layers and second material layers on the sidewalls of the first auxiliary patterns so that a gap region between the first auxiliary patterns adjacent to each other is filled, removing the second material layers, and forming charge storage layers in respective regions from which the second material layers have been removed.

15 Claims, 8 Drawing Sheets

(56) References Cited

U.S. PATENT DOCUMENTS

| | | | |
|---|---|---|---|
| 2011/0032772 A1* | 2/2011 | Aritome | 365/185.29 |
| 2011/0233648 A1* | 9/2011 | Seol et al. | 257/324 |
| 2011/0266606 A1* | 11/2011 | Park et al. | 257/314 |
| 2011/0287623 A1* | 11/2011 | Oh et al. | 438/591 |
| 2011/0294290 A1* | 12/2011 | Nakanishi et al. | 438/666 |
| 2012/0001264 A1* | 1/2012 | Kim et al. | 257/368 |
| 2012/0001345 A1* | 1/2012 | Park et al. | 257/774 |
| 2012/0003828 A1* | 1/2012 | Chang et al. | 438/591 |
| 2012/0012920 A1* | 1/2012 | Shin et al. | 257/324 |
| 2012/0028450 A1* | 2/2012 | Son et al. | 438/479 |
| 2012/0032252 A1* | 2/2012 | Weimer et al. | 257/324 |
| 2012/0043673 A1* | 2/2012 | Chang et al. | 257/786 |
| 2012/0049268 A1* | 3/2012 | Chang et al. | 257/324 |
| 2012/0077320 A1* | 3/2012 | Shim et al. | 438/269 |
| 2012/0086072 A1* | 4/2012 | Yun et al. | 257/329 |
| 2012/0112264 A1* | 5/2012 | Lee et al. | 257/324 |
| 2012/0119283 A1* | 5/2012 | Lee et al. | 257/316 |
| 2012/0120728 A1* | 5/2012 | Kim et al. | 365/185.18 |
| 2012/0208347 A1* | 8/2012 | Hwang et al. | 438/430 |
| 2012/0217565 A1* | 8/2012 | Gay et al. | 257/315 |
| 2012/0280300 A1* | 11/2012 | Kim et al. | 257/315 |
| 2012/0295409 A1* | 11/2012 | Yun et al. | 438/268 |
| 2012/0299086 A1* | 11/2012 | Lee | 257/324 |

* cited by examiner

METHODS OF MANUFACTURING SEMICONDUCTOR DEVICE

CROSS-REFERENCE TO RELATED APPLICATION

This application claims priority under 35 U.S.C. 119(a) to Korean patent application number 10-2011-0138198 filed on Dec. 20, 2011, in the Korean Intellectual Property Office, the entire disclosure of which is incorporated by reference herein.

BACKGROUND

1. Field of Invention

Embodiments of this disclosure relate to methods of manufacturing a semiconductor device and, more particularly, to methods of manufacturing a nonvolatile memory device including nanowires or nanodots.

2. Description of the Related Art

A nonvolatile memory device retains data stored therein even when power is not supplied, and it is divided into a floating gate type or a charge trap type depending on a method of storing electric charges.

A floating gate type nonvolatile memory device includes gate patterns, each formed of a tunnel insulating layer, a floating gate, a charge blocking layer, and a control gate which are sequentially stacked over a substrate. The floating gate type nonvolatile memory device stores data by injecting or discharging electric charges into or from the floating gates. Accordingly, the floating gate functions as a substantial data repository and has a great effect on the characteristics of the memory device.

As the integration of memory devices increases a cell area is reduced, which may lead to increased interference between the floating gates of adjacent memory cells, resulting in a deterioration of characteristics of the memory device.

In order to alleviate this problem, a method of storing data using nanodots or nanowires is being proposed. It is, however, difficult to control the size of a nanodot or nanowire and the position where a nanodot or nanowire is formed in a process of forming the nanodots or nanowires. If nanodots or nanowires are applied to a memory device, memory cells can have different charge storage capacities because the nanodots or nanowires included in the memory cells have different sizes and different positions. As a result, the memory device malfunctions because the threshold voltages of the memory cells are differently when a program or erase operation is performed.

BRIEF SUMMARY

An example embodiment of this disclosure provides a method of manufacturing a semiconductor device including nanodots or nanowires having a uniform size.

In an aspect of the present disclosure, a method of manufacturing a semiconductor device includes forming first auxiliary patterns, alternately forming first material layers and second material layers on the sidewalls of the first auxiliary patterns so that a gap region between the first auxiliary patterns adjacent to each other is filled, removing the second material layers, and forming charge storage layers in respective regions from which the second material layers have been removed.

In another aspect of the present disclosure, a method of manufacturing a semiconductor device includes forming first auxiliary patterns, alternately forming first material layers and second material layers on the sidewalls of the first auxiliary patterns so that a gap region between the first auxiliary patterns adjacent to each other is filled, forming an interlayer insulating layer on the first material layers and the second material layers which have been alternately formed, forming second auxiliary patterns, disposed to cross the first auxiliary patterns, on the interlayer insulating layer, alternately forming third material layers and fourth material layers on the sidewalls of the second auxiliary patterns so that a gap region between the second auxiliary patterns adjacent to each other is filled, removing the fourth material layers between the adjacent second auxiliary patterns, etching the interlayer insulating layer exposed by removing the fourth material layers, etching the second material layers exposed by etching the interlayer insulating layer, and forming charge storage layers in respective regions from which the second material layers have been etched.

DESCRIPTION OF EMBODIMENTS

Hereinafter, some example embodiments of the present disclosure will be described in detail with reference to the accompanying drawings. The figures are provided to allow those having ordinary skill in the art an understanding of a scope of the embodiments of this disclosure.

FIGS. 1A to 1E are perspective views illustrating a method of manufacturing a semiconductor device according to a first embodiment of this disclosure.

Figure 1A:
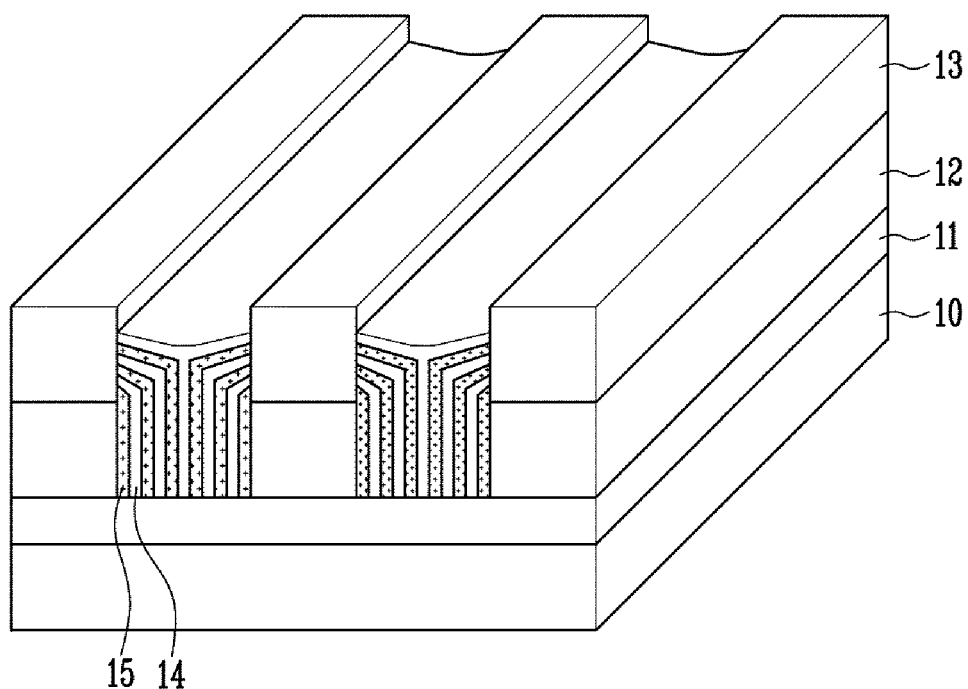
FIGS. 1A to 1E are perspective views illustrating a method of manufacturing a semiconductor device according to a first embodiment of this disclosure.

As shown in FIG. 1A, a tunnel insulating layer 11 is formed on a substrate 10 in which underlying structures, such as isolation layers, are formed. The tunnel insulating layer 11 may be formed of a thermal oxide layer.

A material layer for first auxiliary patterns and a hard mask layer are formed over the tunnel insulating layer 11. The material layer for first auxiliary patterns may be formed of an amorphous silicon layer using a $Si_2H_6$ source, and the hard mask layer may be formed of a silicon oxide layer.

A photoresist pattern is formed on the hard mask layer. Hard mask patterns 13 are formed by etching the hard mask layer using the photoresist pattern as an etch barrier. The hard mask patterns 13 may be formed in a line form and extended in parallel in one direction.

A plurality of first auxiliary patterns 12 is formed by etching the material layer for first auxiliary patterns using the hard mask patterns 13 as an etch barrier. The plurality of first auxiliary patterns 12 may be formed in a line form and extended in parallel in one direction. The first auxiliary pattern 12 is formed of an amorphous silicon layer. The first auxiliary patterns 12 are grown into polysilicon layers or single crystalline forms by performing a thermal treatment process at a temperature of 600° C. or higher.

The first auxiliary patterns 12 function as guide lines for forming nanodots or nanowires, and also as seeds for growing silicon.

Next, first material layers 14 and second material layers 15 are alternately formed on the sidewalls of the first auxiliary patterns 12 so that a gap region between the first auxiliary patterns 12 adjacent to each other, is filled.

Each of the first material layer 14 and the second material layer 15 has a thickness of 0.5 to 5 nm. The first material layers 14 and the second material layers 15 are made of materials having a high etch selectivity difference.

For example, the first material layers 14 and the second material layers 15 may be alternately grown using a selective epitaxial growth (SEG) process. In this case, the first auxiliary patterns 12 formed of polysilicon layers become seeds, so the first material layers 14 and the second material layers 15 are grown on sidewalls of the first auxiliary patterns 12 in a direction vertical to the substrate 10. Here, the first material layers 14 and the second material layers 15 are not grown from the bottom of the gap region because the tunnel insulating layer 11, exposed at the bottom of the gap region between the first auxiliary patterns 12, does not function as a seed.

The first material layer 14 may be formed of a silicon (Si) layer, and the second material layer 15 may be formed of a SiGe (Silicon-Germanium) layer. In this case, the Si layer may be formed using a mixture gas of Dichloro Silane (DCS) and HCl (Hydrogen Chloride), and the SiGe layer may be formed by adding a $GeH_4$ (Germane) gas to the mixture gas. As a result, the first material layers 14 and the second material layers 15 may be formed in the same equipment using an in-situ process.

In some embodiments, the first material layer 14 may be formed of an undoped silicon layer not including impurities, and the second material layer may be formed of a doped silicon layer including impurities.

In some embodiments, the first material layers 14 and the second material layers 15 may be alternately formed by an atomic layer deposition (ALD) process. For example, the first material layer 14 and the second material layer 15 may be formed of an oxide layer and a nitride layer, respectively, which have a high etch selectivity difference.

In this case, after depositing the first material layer 14 or the second material layer 15 on the sidewalls of the first auxiliary patterns 12 and the bottom of the gap region between the first auxiliary patterns 12 adjacent to each other, the first material layer 14 or the second material layer 15 formed at the bottom of the gap region is removed in a purge process. In this process, a difference in an adsorption ratio, depending on the position where the first material layer 14 or the second material layer 15, is formed is employed.

Here, the first material layer 14 or the second material layer 15 formed at the bottom of the gap region has a relatively low adsorption ratio because it is formed on the tunnel insulating layer 11 formed of an oxide layer, for example. In contrast, the first material layer 14 and the second material layer 15 on the sidewalls of the first auxiliary patterns 12 has a relatively high adsorption ratio because it is formed on the polysilicon layer (for example, a Si layer or a SiGe layer). For this reason, the first material layers 14 and the second material layers 15 are alternately formed while removing the first material layer 14 or the second material layer 15, formed at the bottom of the gap region and formed to have a low adsorption ratio, in a purge process.

Figure 1B:
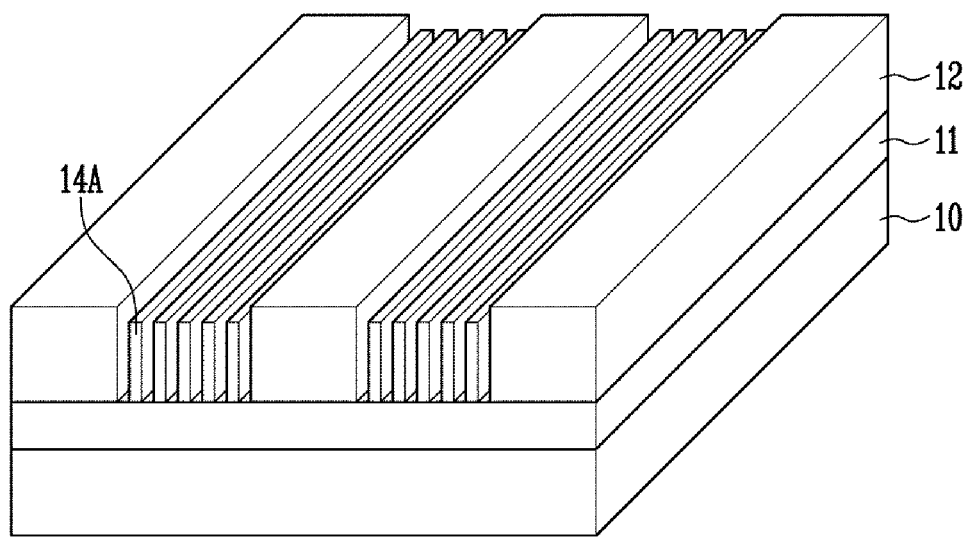

As shown in FIG. 1B, the first material layers 14 and the second material layers 15 are etched to a specific depth so that the second material layers 15 are exposed. For example, the first material layers 14 and the second material layers 15 may be etched by a blanket etch process.

The second material layers 15 exposed by the etch process are selectively removed. This process is performed to remove one or an other of the first material layers 14 and the second material layers 15, that is, heterogeneous layers, and thus the first material layers 14 may be removed instead of the second material layers 15.

For example, the second material layers 15 may be removed by a wet etch process using a solution in which $HNO_3$ (Nitric Acid) (70%), HF (Hydrofluoric Acid) (49%), $CH_3COOH$ (99.9%) (Acetic Acid), and $H_2O$ (Water) are mixed in a ratio of 40:1:2:57.

Prior to the wet etch process, a thermal treatment process may be performed using a rapid thermal annealing (RTA) or furnace method in a temperature of 700 to 1000° C. In this case, adhesion between the first material layers 14 and the tunnel insulating layer 11 is improved, with the result that an interfacial characteristic between the first material layers 14 and the tunnel insulating layer 11 is prevented from deteriorating due to a damaged interface between the first material layer 14 and the tunnel insulating layer 11 in a subsequent wet etch process.

In FIG. 1B, the first material layer remaining between the first auxiliary patterns 12 after the etch process is denoted by 14A.

Figure 1C:
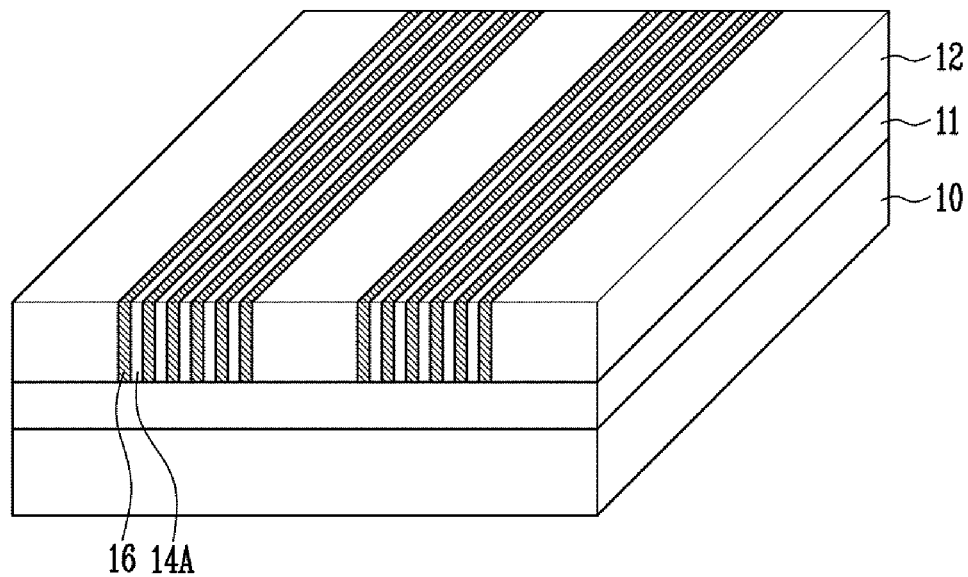

As shown in FIG. 1C, charge storage layers 16 are formed in a nanowire form by filling the regions from which the second material layers 15 are removed with respective metal layers. The plurality of nanowires is configured to have a uniform size, be arranged at uniform intervals, and extend in parallel in one direction.

For example, after depositing a metal layer by an atomic layer deposition (ALD) process, a blanket etch process may be performed in order to separate the nanowires from each other. The metal layer may be made of ruthenium (Ru), tungsten (W), tantalum (Ta), titanium (Ti), zirconium (Zr), aluminum (Al), hafnium (Hf), iron (Fe), cobalt (Co), or nickel (Ni) or a combination of thereof. The metal layer may be deposited in thickness of 2 to 10 nm. After forming the charge storage layers 16, the first auxiliary patterns 12 may be removed.

Figure 1D:
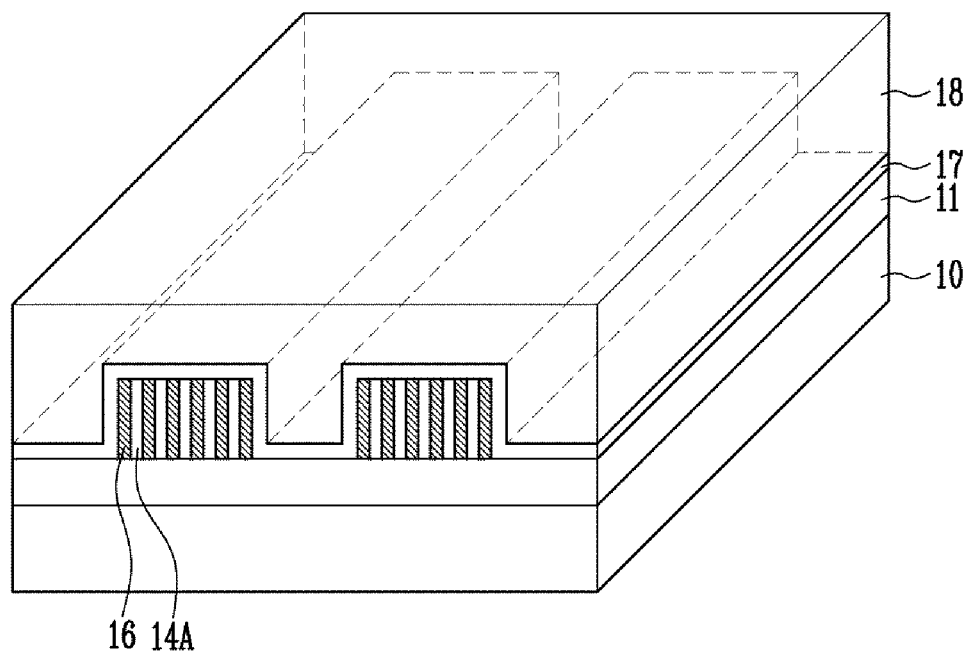

As shown in FIG. 1D, after removing the first auxiliary patterns 12, a charge blocking layer 17 is formed on the entire structure remaining after removal of the first auxiliary patterns 12. A conductive layer 18 for gate lines is formed on the charge blocking layer 17.

Figure 1E:
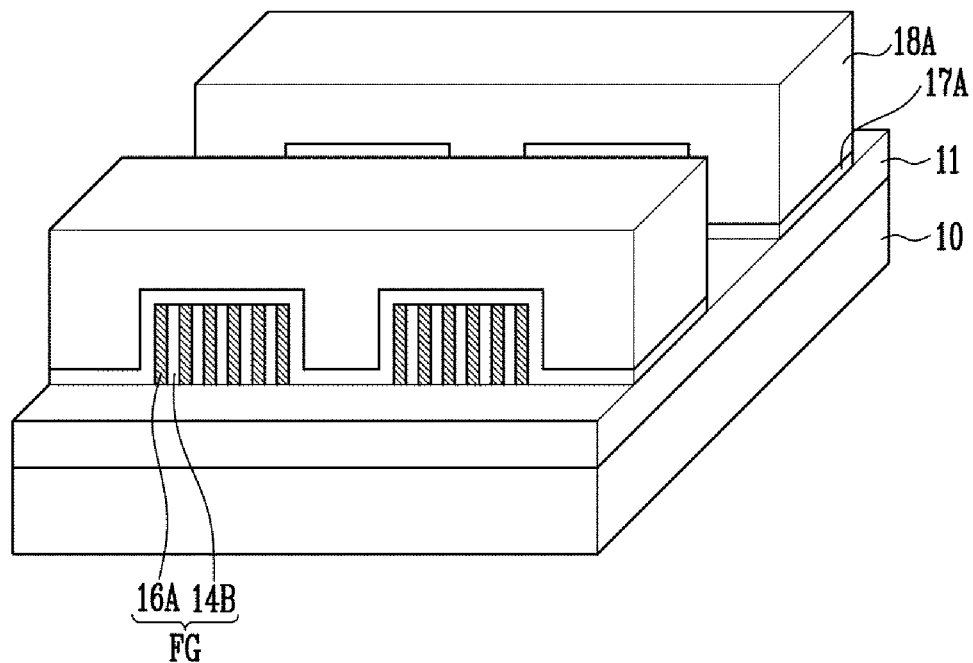

As shown in FIG. 1E, a mask pattern (not shown) for gate patterns is formed on the conductive layer 18 for gate lines. Gate patterns are formed by etching the conductive layer 18 for gate lines, the charge blocking layer 17, the first material layers 14A, and the charge storage layers 16. The gate patterns may be formed by using the mask pattern as an etch barrier.

As a result, the gate patterns including the etched charge storage layers 16A are formed. In particular, memory cells include respective floating gates FG, each including the charge storage layer 16A and a first material layer 14B alternately arranged. Furthermore, the floating gates FG include the respective charge storage layers 16A formed to have nanowire forms of a uniform size and arranged at uniform intervals, with the result that the memory cells have a uniform characteristic.

FIGS. 2A to 2D are perspective views illustrating a method of manufacturing a semiconductor device according to a second embodiment of this disclosure.

Figure 2A:
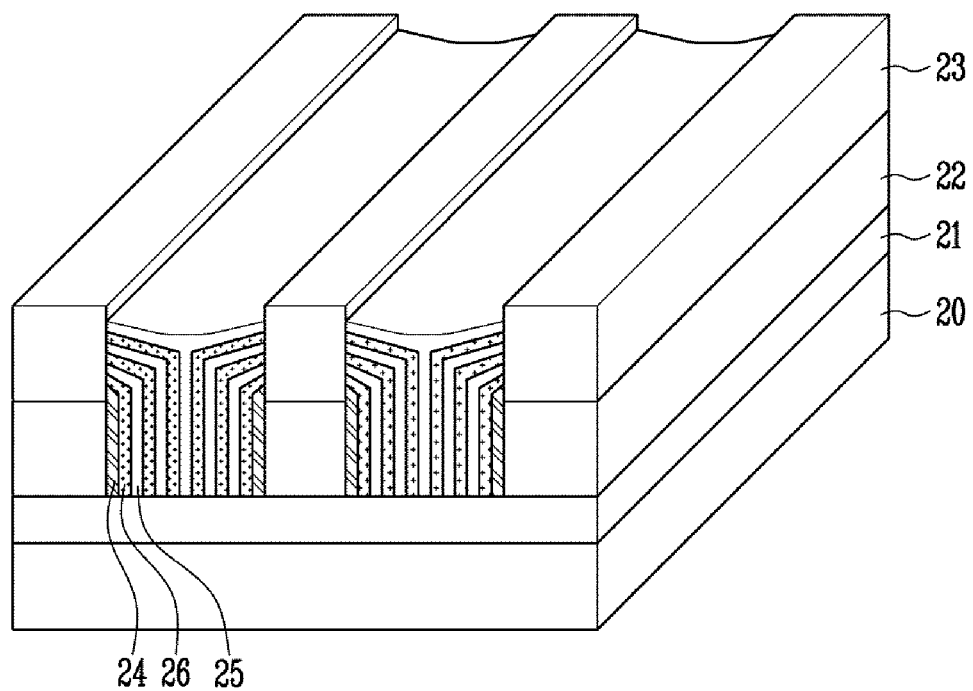
FIGS. 2A to 2D are perspective views illustrating a method of manufacturing a semiconductor device according to a second embodiment of this disclosure.

As shown in FIG. 2A, a tunnel insulating layer 21 is formed over a substrate 20. A material layer for first auxiliary patterns and a hard mask layer are formed over the tunnel insulating layer 21. Photoresist patterns (not shown) are formed on the hard mask layer. Hard mask patterns 23 are formed by etching the hard mask layer using the photoresist patterns as an etch barrier.

A plurality of first auxiliary patterns 22 is formed by etching the material layer for first auxiliary patterns using the hard mask patterns 23 as an etch barrier. The first auxiliary patterns 22 may be formed in a line form and extended in parallel in one direction. The first auxiliary patterns 22 are used as guide lines for forming nanodots or nanowires. For example, the first auxiliary pattern 22 may be formed of an insulating layer, such as an oxide layer or a nitride layer.

Seed layers 24 are formed on the sidewalls of the first auxiliary patterns 22 adjacent to each other. The seed layers 24 may extend to also be formed on the sidewalls of the hard mask patterns 23 stacked on the first auxiliary patterns 22 adjacent to each other. The seed layers 24 are used as seeds for growing first material layers or second material layers in a subsequent process and may be formed of a polysilicon layer.

For example, a material layer for seeds may be formed on the entire structure of the results in which the first auxiliary patterns 22 have been formed. The seed layers 24 each having a spacer form may be formed on the sidewalls of the first auxiliary patterns 22 by removing the material layer for seeds, formed at the bottom of a gap region between the first auxiliary patterns 22 adjacent to each other, by a blanket etch process.

First material layers 25 and second material layers 26 are alternately formed on the sidewalls of the first auxiliary patterns 22 so that the gap region between the first auxiliary patterns 22 in which the seed layers 24 has been formed is filled.

For example, the first material layers 25 and the second material layers 26 may be alternately grown by a selective epitaxial growth (SEG) process. In this case, the first material layer 25 may be formed of a Si layer, and the second material layer 26 may be formed of a SiGe layer. In some embodiments, the first material layer 25 may be formed of an undoped silicon layer not including impurities, and the second material layer 26 may be formed of a doped silicon layer including impurities.

In some embodiments, the first material layers 25 and the second material layers 26, that is, heterogeneous layers, may be alternately formed by an atomic layer deposition (ALD) method without forming the seed layers 24. In this case, the second material layer 26 to be removed in a subsequent process may be made of material having a high etch selectivity with respect to the tunnel insulating layer 21. For example, the first material layer 25 may be formed of an oxide layer, and the second material layer 26 may be formed of a nitride layer.

Figure 2B:
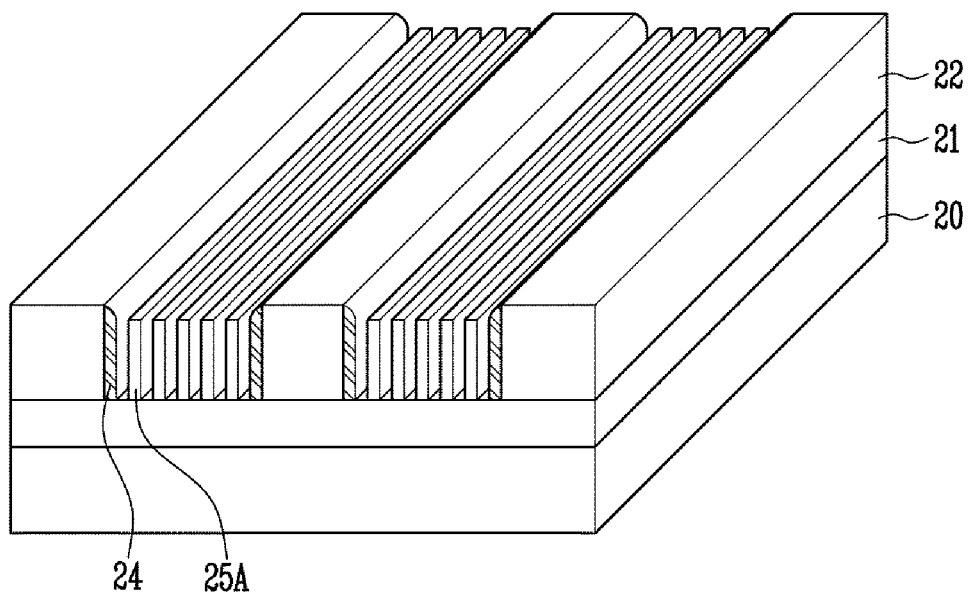

As shown in FIG. 2B, the first material layers 25 and the second material layers 26 are etched to a specific depth so that the second material layers 26 are exposed. The exposed second material layers 26 are selectively removed. This process is performed to open nanowire regions by etching one of the heterogeneous material layers formed in the gap regions, and thus the first material layers 25 may be removed instead of the second material layers 26. In one example, the exposed second material layers 26 may be removed by a wet etch process.

In FIG. 2B, the first material layer remaining between the first auxiliary patterns 22 after the etch process is denoted by 25A.

Figure 2C:
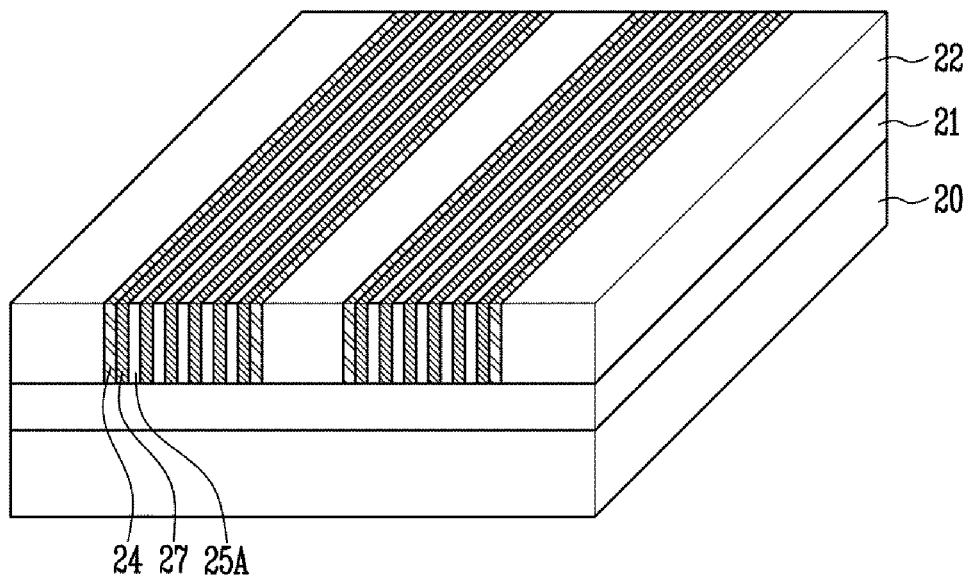

As shown in FIG. 2C, charge storage layers 27 are formed in the regions from which the second material layers 26 have been removed. The charge storage layers 27 are formed in the form of a plurality of nanowires. The plurality of nanowires is configured to have a uniform size, to arranged at uniform intervals, and extend in parallel in one direction. For example, the plurality of nanowires may be formed by depositing a metal layer by an atomic layer deposition (ALD) process and then performing a blanket etch process.

Figure 2D:
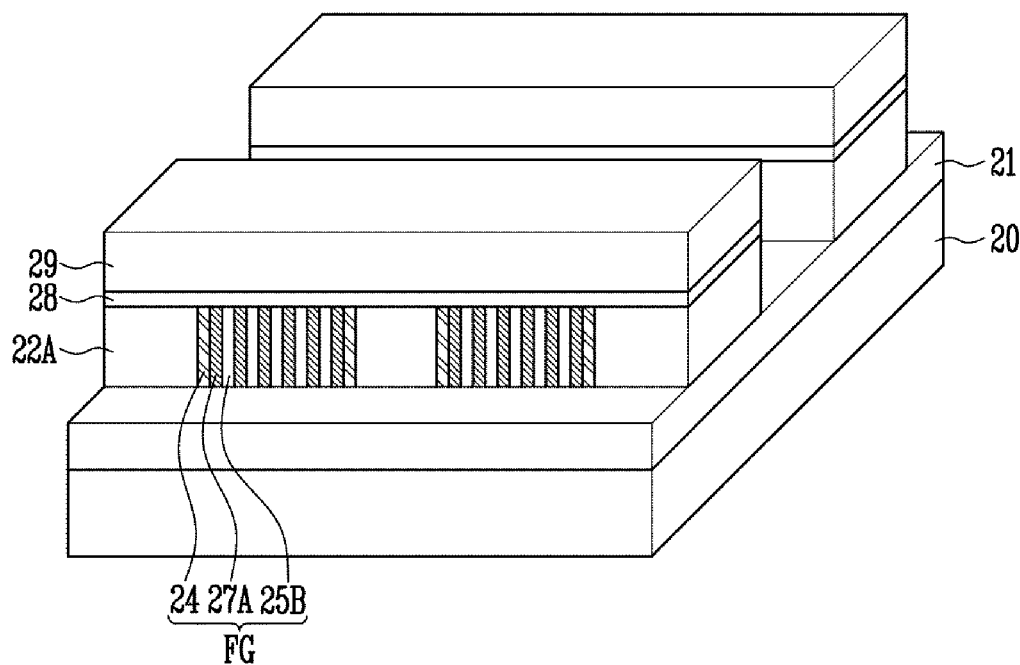

As shown in FIG. 2D, a charge blocking layer 28 is formed on the results in which the charge storage layers have been formed. A conductive layer 29 for gate lines is formed on the charge blocking layer 28. FIG. 2D shows a case where the charge blocking layer 28 is formed in the state in which the first auxiliary patterns 22A, formed of insulating layers, remain intact. In some embodiments, the first auxiliary patterns 22 may be removed before forming the charge blocking layer 28.

A mask pattern (not shown) for gate patterns is formed on the conductive layer 29 for gate lines. Gate patterns are formed by etching the conductive layer 29 for gate lines, the charge blocking layer 28, the first material layers 25A, the first auxiliary patterns 22, and the charge storage layers 27 using the mask pattern for gate patterns as an etch barrier.

As a result, the gate patterns including the charge storage layers 27A are formed. In particular, memory cells include respective floating gates FG, each including the charge storage layer 27A and a first material layer 25B alternately arranged. The floating gates FG may further include the seed layers 24. Furthermore, the floating gates FG include the respective charge storage layers 27A configured to have a uniform size and arranged at uniform intervals, with the result that the memory cells have a uniform characteristic.

FIGS. 3A to 3E are perspective views illustrating a method of manufacturing a semiconductor device according to a third embodiment of this disclosure.

Figure 3A:
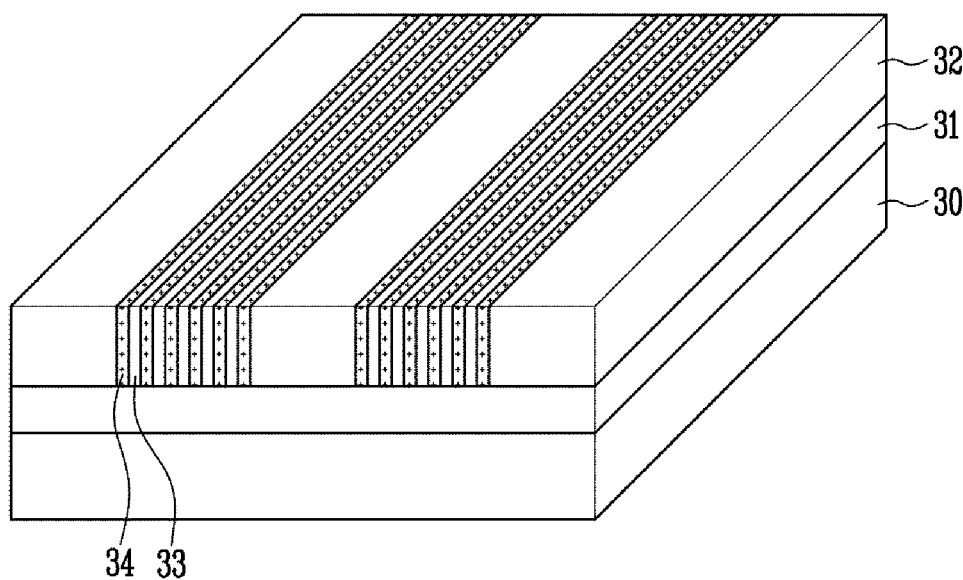
FIGS. 3A to 3E are perspective views illustrating a method of manufacturing a semiconductor device according to a third embodiment of this disclosure.

As shown in FIG. 3A, a plurality of first auxiliary patterns 32 is formed over a substrate 30 on which a tunnel insulating layer 31 is formed. First material layers 33 and second material layers 34 are alternately formed between the first auxiliary patterns 32. The first auxiliary patterns 32, the first material layers 33, and the second material layers 34 may be formed in a substantially same manner as in the first embodiment or the second embodiment.

Figure 3B:
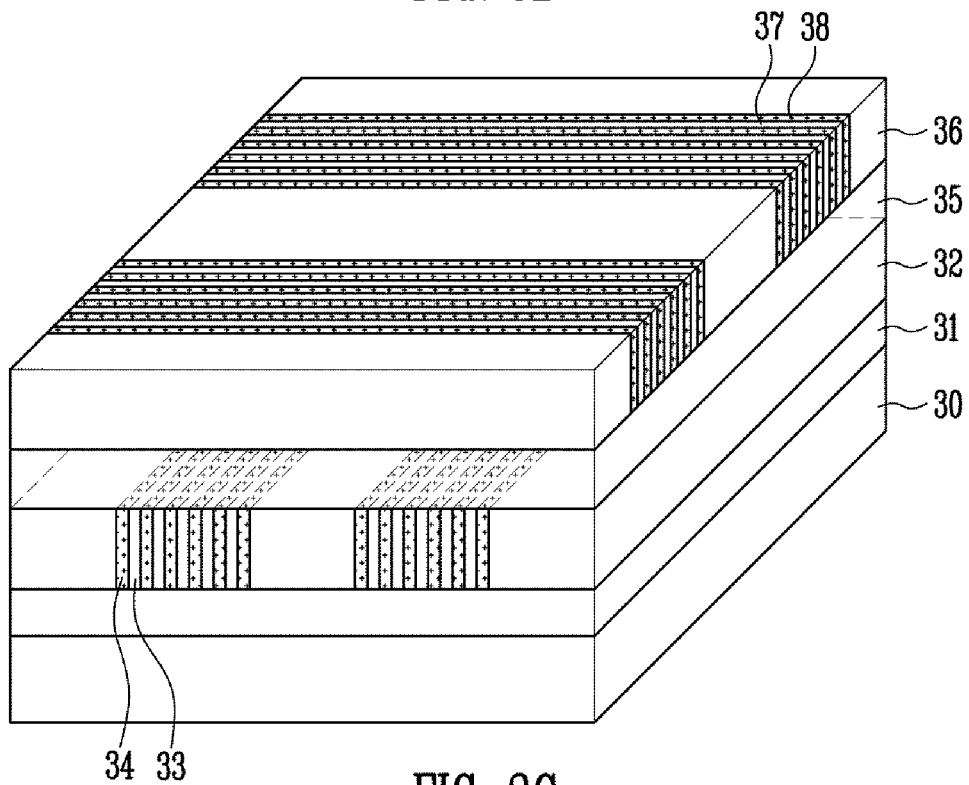

As shown in FIG. 3B, an interlayer insulating layer 35 is formed on the first material layers 33 and the second material layers 34 which have been formed. Second auxiliary patterns 36 are formed on the interlayer insulating layer 35 and extended in parallel in a direction to cross the first auxiliary patterns 32 in a substantially perpendicular manner. Third material layers 37 and fourth material layers 38 are alternately formed between the second auxiliary patterns 36 adjacent to each other. The second auxiliary patterns 36, the third material layers 37, and the fourth material layers 38 may be made of the same materials as the first auxiliary patterns, the first material layers, and the second material layers described with reference to the first embodiment or the second embodiment and may be formed by the same methods described with reference to those of the first embodiment or the second embodiment.

Figure 3C:
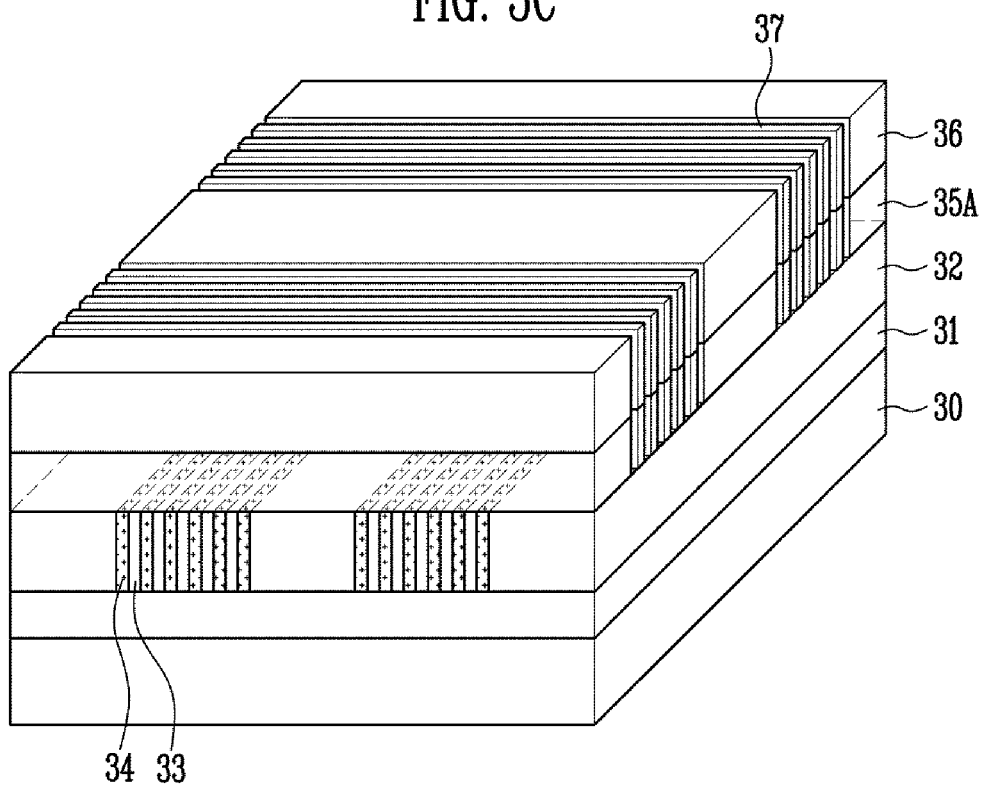

As shown in FIG. 3C, the fourth material layers 38 formed between the second auxiliary patterns 36 are removed. In one example, the fourth material layers 38 may be removed by a wet etch process.

The interlayer insulating layer 35 exposed by removing the fourth material layers 38 is etched. For example, the interlayer insulating layer 35 may be etched by a dry etch process. In FIG. 3C, the etched interlayer insulating layer is denoted by 35A.

Figure 3D:
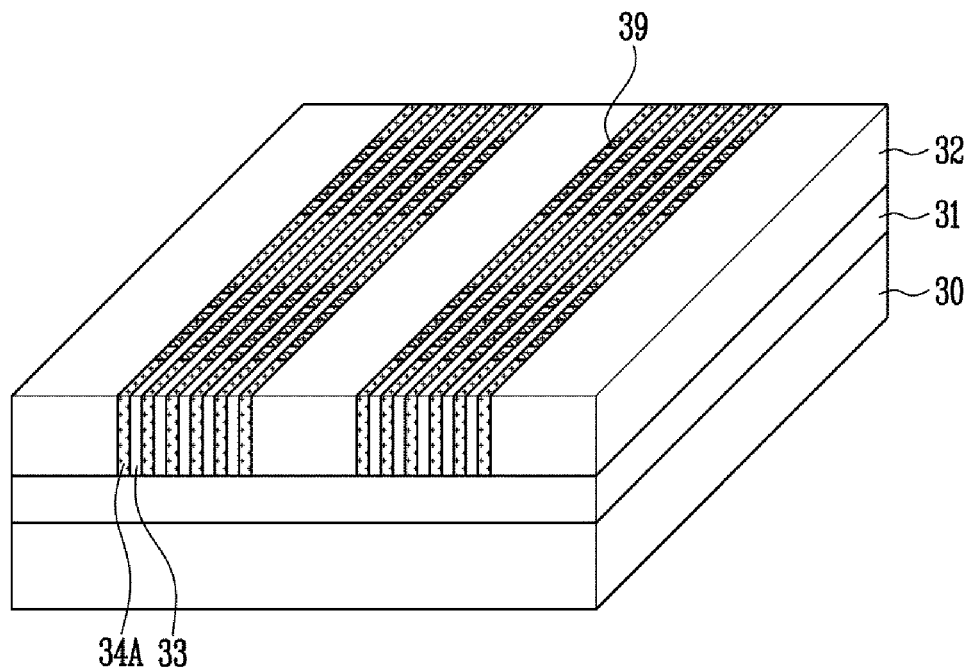

As shown in FIG. 3D, parts of the second material layers 34 are selectively removed so that the second material layers 34 remain in a dot form. That is, holes for forming nanodots are formed by selectively removing the second material layers 34 in regions exposed by etching the interlayer insulating layer 35. In one example, the second material layers 34 may be etched by a dry etch process.

The second auxiliary patterns 36, and the third material layers 37 and the interlayer insulating layer 35A which remain between the second auxiliary patterns 36 are removed.

Charge storage layers 39 are formed in the holes. More particularly, the charge storage layers 39 including nanodots are formed by filling the regions from which the second material layers 34 have been selectively removed with nanodots. Here, the charge storage layers 39 may be formed in a dot form. For example, the charge storage layers 39, uniformly arranged in a matrix form and configured in the form of dots having a uniform size, may be formed by depositing nanodots or a metal layer by an atomic layer deposition (ALD) process.

Figure 3E:
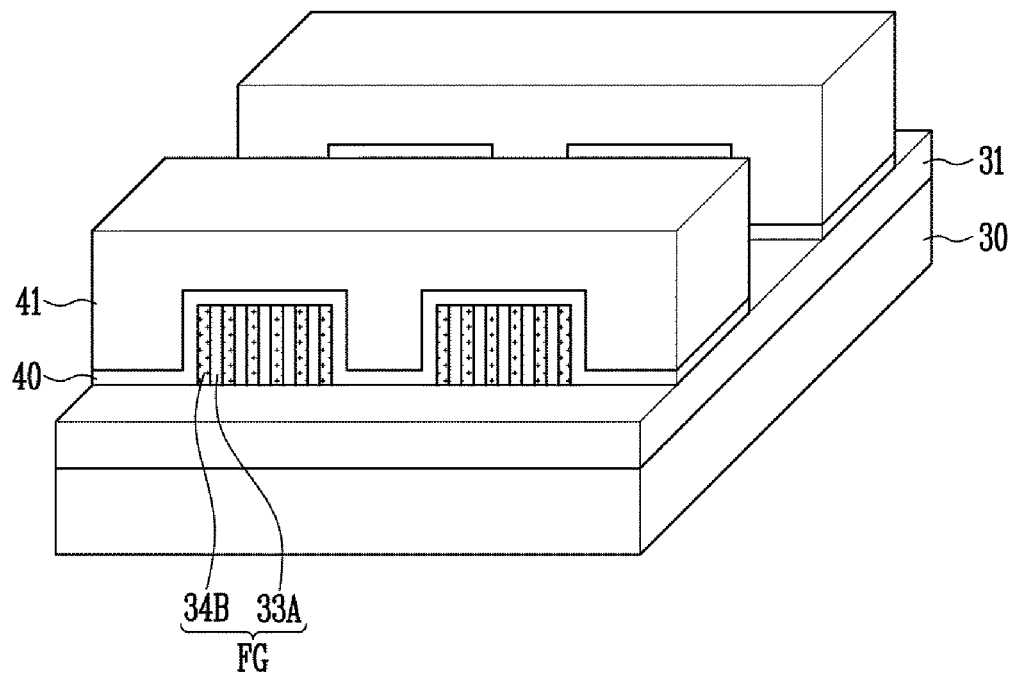

As shown in FIG. 3E, a charge blocking layer 40 and a conductive layer 41 for gate lines are formed over the results in which the charge storage layers 39 have been formed. Gate patterns are formed by etching the charge blocking layer 40 and the conductive layer 41. Here, the gate patterns may be formed in a substantially same manner as in the first embodiment or the second embodiment.

As a result, the gate patterns including the charge storage layers 39 are formed. In particular, memory cells include respective floating gates FG, each including the charge storage layers 39, the first material layer 33A, and a second material layer 34B. Furthermore, the floating gates FG include the charge storage layers 39 arranged in a matrix form and configured to have a uniform size, with the result that memory cells have a uniform characteristic.

Figure 4:
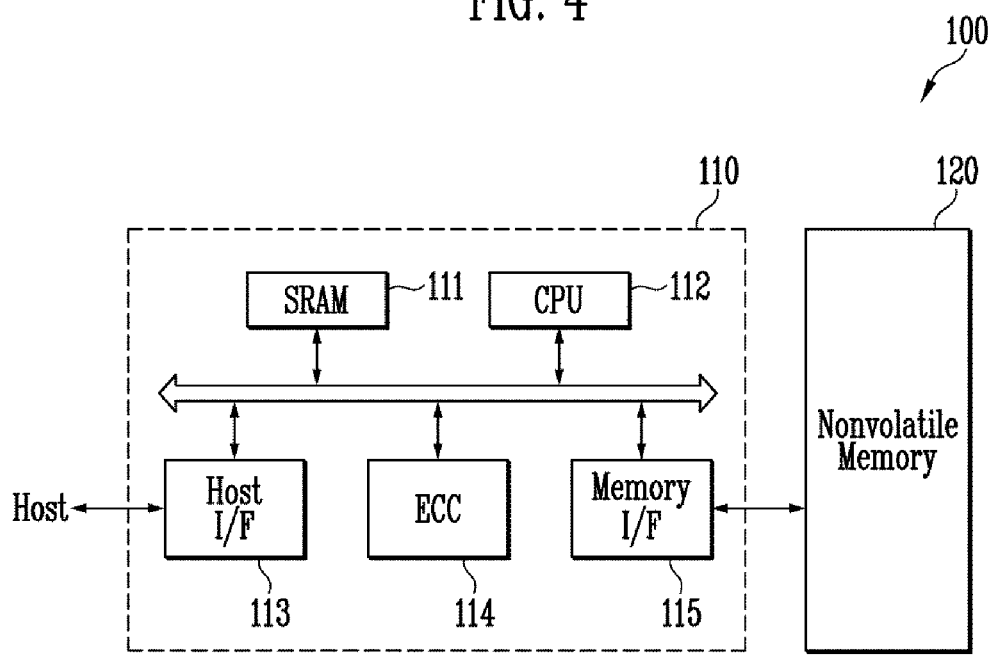
FIG. 4 shows a construction of a memory system according to an embodiment of this disclosure.

FIG. 4 shows a construction of a memory system according to one embodiment of this disclosure.

As shown in FIG. 4, the memory system 100 according to one embodiment of this disclosure includes a nonvolatile memory device 120 and a memory controller 110.

The nonvolatile memory device 120 is configured to have a cell array including the above-described structure. In some embodiments, the non-volatile memory device 120 may be a multi-chip package including a plurality of flash memory chips.

The memory controller 110 is configured to control the nonvolatile memory device 120, and it may include SRAM 111, a central processing unit (CPU) 112, a host interface (I/F) 113, an error correction code (ECC) circuit 114, and a memory interface (I/F) 115. The SRAM 111 is used as the operating memory of the CPU 112. The CPU 112 performs an overall control operation for the data exchange of the memory controller 110. The host I/F 113 is equipped with the data exchange protocol of a host that accesses the memory system 100. Furthermore, the ECC circuit 114 circuit detects and corrects errors included in data read from the nonvolatile memory device 120. The memory I/F 115 performs as an interface with the nonvolatile memory device 120. The memory controller 110 may further include RCM for storing code data for an interface with the host.

The memory system 100 configured as described above may be a memory card or a solid state disk (SSD) in which the nonvolatile memory device 120 and the controller 110 are combined. For example, if the memory system 100 is an SSD, the memory controller 110 may communicate with the outside (for example, a host) through one of various interface protocols, such as a USB, MMC, PCI-E, SATA, PATA, SCSI, ESDI, and IDE.

Figure 5:
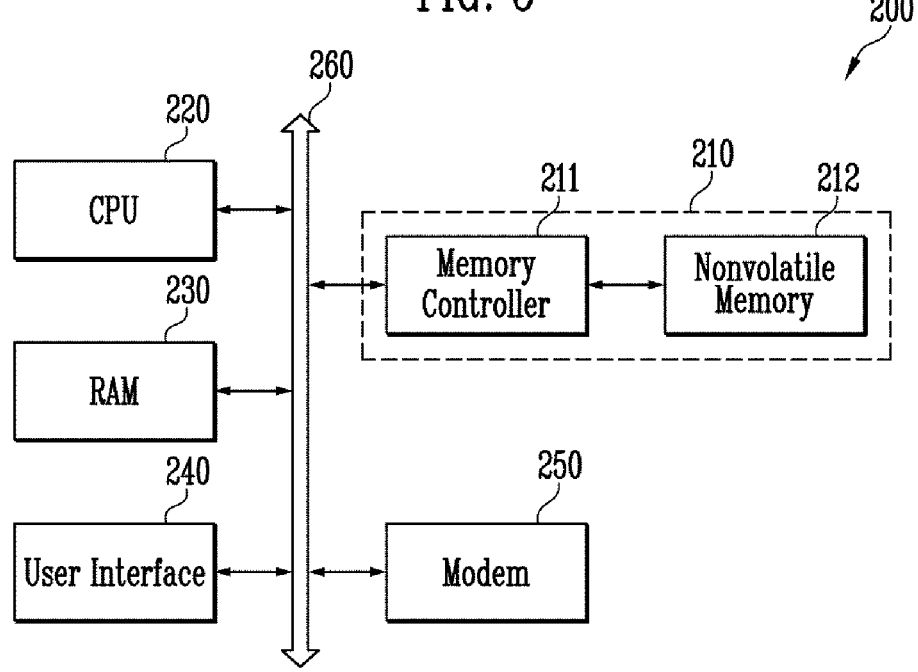
FIG. 5 shows a construction of a computing system according to an embodiment of this disclosure.

FIG. 5 shows a construction of a computing system according to one embodiment of this disclosure.

As shown in FIG. 5, the computing system 200 according to one embodiment of this disclosure may include a CPU 220, RAM 230, a user interface 240, a modem 250, and a memory system 210 all of which are electrically coupled to a system bus 260. If the computing system 200 is a mobile device, the computing system 200 may further include a battery for supplying operating voltages to the computing system 200. The computing system 200 may further include application chipsets, a camera image processor (CIS), mobile DRAM, and so on.

The memory system 210 may include a non-volatile memory device 212 and a memory controller 211, such as those described with reference to shown in FIG. 4.

In accordance with this technology, nanodots or nanowires having a uniform size can be formed. Furthermore, the memory cells can have a uniform characteristic because the nanodots or the nanowires are uniformly distributed.

What is claimed is:

1. A method of manufacturing a semiconductor device, the method comprising:
    forming first auxiliary patterns;
    alternately forming first material layers and second material layers on sidewalls of the first auxiliary patterns so that a gap region between the first auxiliary patterns adjacent to each other is filled;
    removing the second material layers; and
    forming charge storage layers in a nanowire form by filling the regions from which the second material layers have been removed with respective metal layers.

2. The method of claim 1, wherein removing the second material layers is performed by a wet etch process.

3. The method of claim 1, wherein alternately forming the first material layers and the second material layers comprises alternately growing the first material layers and the second material layers having a high etch selectivity to the first material layers by a selective epitaxial growth (SEG) using the first auxiliary patterns as seeds.

4. The method of claim 1, wherein alternately forming the first material layers and the second material layers comprises:
    forming seed layers on sidewalls of the first auxiliary patterns; and
    alternately growing the first material layers and the second material layers, having a high etch selectivity to the first material layers, by an SEG process using the seed layers.

5. The method of claim 1, wherein alternately forming the first material layers and the second material layers comprises alternately forming the first material layers and the second material layers, having a high etch selectivity to the first material layers, on sidewalls of the first auxiliary patterns by an atomic layer deposition (ALD) process.

6. The method of claim 5, wherein alternately forming the first material layers and the second material layers comprises:
    depositing the first material layer or the second material layer on sidewalls of the first auxiliary patterns and at a bottom of the gap region between the first auxiliary patterns, and
    removing the first material layer or the second material layer formed at the bottom of the gap region in a purge process.

7. The method of claim 1, further comprising:
    removing the first auxiliary patterns after forming the charge storage layers;

forming a charge blocking layer on results from which the first auxiliary patterns have been removed;

forming a conductive layer for gate lines on the charge blocking layer; and forming the gate lines by etching the conductive layer for the gate lines, the charge blocking layer, the charge storage layers, and the first material layers.

8. The method of claim 1, further comprising:

forming a charge blocking layer on the formed charge storage layers;

forming a conductive layer for gate lines on the charge blocking layer; and forming the gate lines by etching the conductive layer for the gate lines, the charge blocking layer, the first auxiliary patterns, the charge storage layers, and the first material layers.

9. A method of manufacturing a semiconductor device, the method comprising:

forming first auxiliary patterns;

alternately forming first material layers and second material layers on sidewalls of the first auxiliary patterns so that a gap region between the first auxiliary patterns adjacent to each other is filled;

removing the second material layers; and forming charge storage layers in a dot form including nanodots by filling the regions from which the second material layers have been removed with the nanodots.

10. The method of claim 9, wherein removing the second material layers comprises selectively removing part of each of the second material layers so that the second material layers remain in a dot form.

11. The method of claim 10, wherein selectively removing the second material layers comprises:

forming an interlayer insulating layer on the first material layers and the second material layers which have been alternately formed;

forming second auxiliary patterns, disposed to cross the first auxiliary patterns, on the interlayer insulating layer;

alternately forming third material layers and fourth material layers on sidewalls of the second auxiliary patterns so that a gap region between the second auxiliary patterns adjacent to each other is filled;

removing the fourth material layers between the adjacent second auxiliary patterns;

etching the interlayer insulating layer exposed by removing the fourth material layers; and etching the second material layers between the adjacent first auxiliary patterns exposed by etching the interlayer insulating layer.

12. The method of claim 11, further comprising removing the second auxiliary patterns, the third material layers that remain between the second auxiliary patterns and the interlayer insulating layer, before forming the charge storage layers.

13. A method of manufacturing a semiconductor device, the method comprising:

forming first auxiliary patterns;

alternately forming first material layers and second material layers on sidewalls of the first auxiliary patterns so that a gap region between the first auxiliary patterns adjacent to each other is filled;

forming an interlayer insulating layer on the first material layers and the second material layers which have been alternately formed;

forming second auxiliary patterns, disposed to cross the first auxiliary patterns, on the interlayer insulating layer;

alternately forming third material layers and fourth material layers on sidewalls of the second auxiliary patterns so that a gap region between the second auxiliary patterns adjacent to each other is filled;

removing the fourth material layers between the adjacent second auxiliary patterns;

etching the interlayer insulating layer exposed by removing the fourth material layers;

etching the second material layers exposed by etching the interlayer insulating layer; and forming charge storage layers in respective regions from which the second material layers have been etched.

14. The method of claim 13, further comprising:

removing the second auxiliary patterns, the third material layers that remain between the second auxiliary patterns and the interlayer insulating layer, before forming the charge storage layers;

removing the first auxiliary patterns after forming the charge storage layers;

forming a charge blocking layer on results from which the first auxiliary patterns have been removed;

forming a conductive layer for gate lines on the charge blocking layer; and forming the gate lines by etching the conductive layer for the gate lines, the charge blocking layer, and the first material layers.

15. The method of claim 13, further comprising:

removing the second auxiliary patterns, the third material layers that remain between the second auxiliary patterns and the interlayer insulating layer, before forming the charge storage layers;

forming a charge blocking layer on the formed charge storage layers;

forming a conductive layer for gate lines on the charge blocking layer; and forming the gate lines by etching the conductive layer for the gate lines, the charge blocking layer, the first auxiliary patterns, and the first material layers.

* * * * *